(12) United States Patent
Tan et al.

(10) Patent No.: US 7,977,702 B2
(45) Date of Patent: Jul. 12, 2011

(54) SURFACE TEXTURED LEDS AND METHOD FOR MAKING THE SAME

(75) Inventors: Michael R. T. Tan, Menlo Park, CA (US); Michael H. Leary, Mountain View, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/592,486

(22) Filed: Nov. 2, 2006

(65) Prior Publication Data

US 2008/0105882 A1   May 8, 2008

(51) Int. Cl.
*H01L 33/00* (2010.01)
(52) U.S. Cl. .............................. 257/103; 257/79; 257/95
(58) Field of Classification Search .................. 257/103, 257/79, 95, E33.01
See application file for complete search history.

(56) References Cited

U.S. PATENT DOCUMENTS

| | | | |
|---|---|---|---|
| 2004/0012980 A1* | 1/2004 | Sugiura et al. | 362/560 |
| 2005/0277218 A1* | 12/2005 | Nakajo et al. | 438/46 |
| 2006/0145170 A1* | 7/2006 | Cho | 257/95 |
| 2006/0186424 A1* | 8/2006 | Fujimoto et al. | 257/98 |

* cited by examiner

*Primary Examiner* — Cuong Q Nguyen
*Assistant Examiner* — Trang Q Tran

(57) ABSTRACT

A light-emitting device that includes an LED and a light extraction layer and the method for making the same are disclosed. The LED includes a substrate on which an active layer is sandwiched between a p-type layer and an n-type layer, the active layer generating light in a band of wavelengths about a central wavelength when holes and electrons recombine therein. The n-type layer, active layer, and p-type layer are formed on the substrate. First and second electrodes for providing a potential difference between the p-type layer and the n-type layer are included in the LED. The light extraction layer includes a clear layer of material having a first surface in contact with a surface of the LED and a second surface having light scattering features with dimensions greater than 0.5 times the central wavelength. The material of the clear layer can be polycrystalline or amorphous.

8 Claims, 2 Drawing Sheets

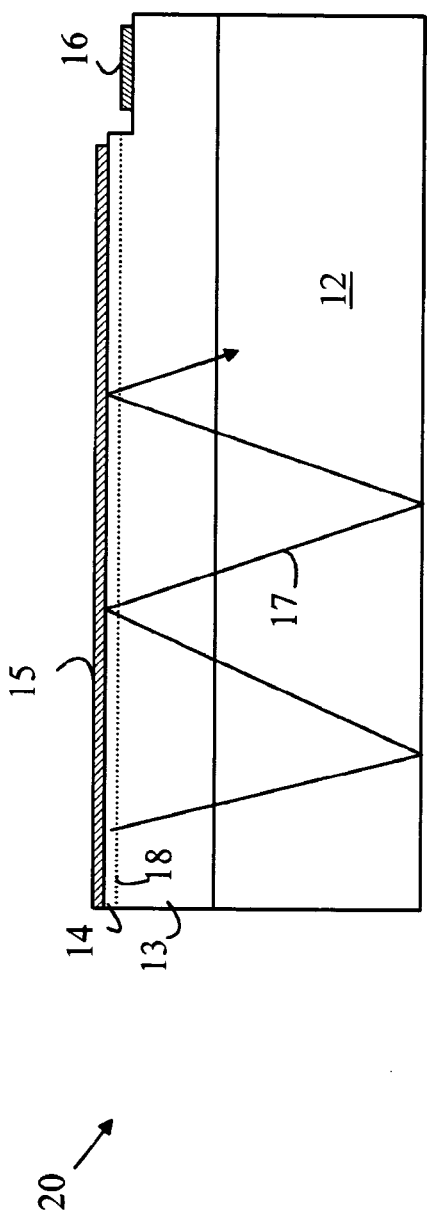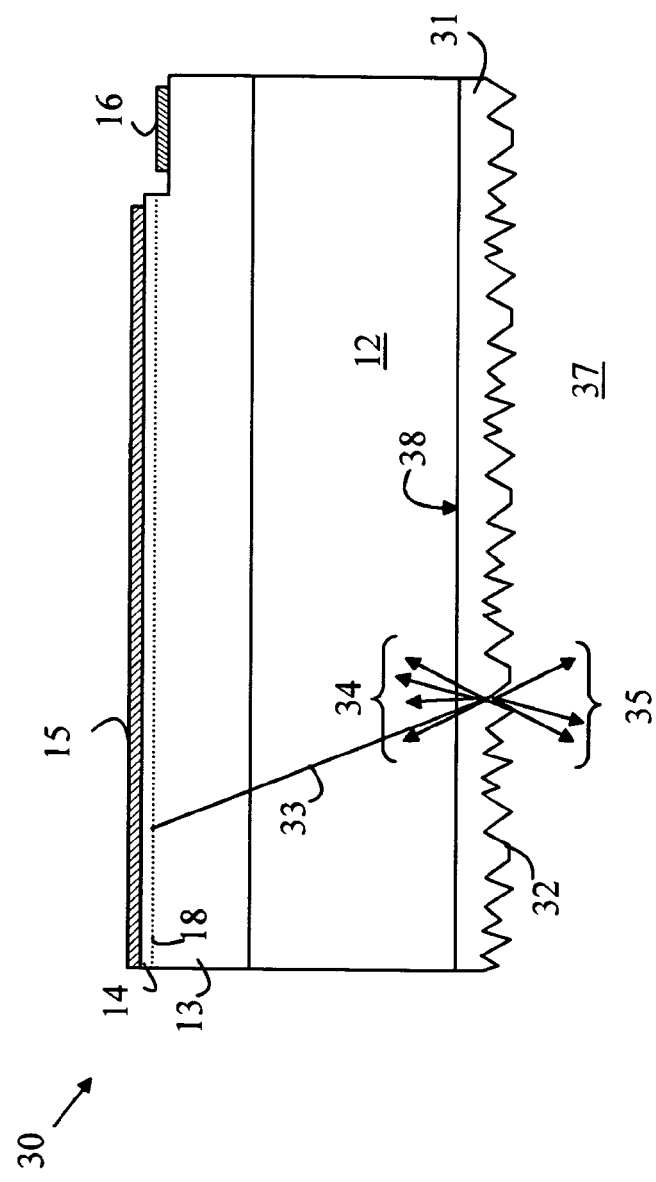

SURFACE TEXTURED LEDS AND METHOD FOR MAKING THE SAME

BACKGROUND OF THE INVENTION

LEDs are typically constructed by growing a p-i-n diode on a substrate. The diode is constructed by growing a layer of n-doped material on the substrate, growing a light generation region on the n-doped layer, and then growing the layer of p-doped material on top of the n-doped material. An electrode is then deposited on the top surface of the p-doped layer, and a contact is made to the n-doped layer. Light may be extracted either through the substrate or through the electrode on top of the p-doped material. If the light is to be removed through the top electrode, the electrode is constructed from a transparent material such as indium tin oxide or a very thin layer of gold.

The efficiency of an LED is the product of two efficiencies, the efficiency with which power applied to the electrodes is converted to light and the efficiency with which that light is coupled out of the device. For GaN-based LEDs fabricated on sapphire substrates, a large fraction of the light generated in the diode is lost because of poor coupling efficiency. GaN has an index of refraction that is much higher than that of air or epoxy encapsulants. Accordingly, only light impinging on the surface of the diode in a small cone of angles will escape the surface. Most of the remaining light is reflected back into the GaN layer and is trapped in a waveguide bounded by the sapphire substrate bottom surface and the GaN top surface. Much of this trapped light is eventually absorbed within the device. Accordingly, the efficiency of GaN diodes is less than ideal.

One method that has been suggested for improving the extraction efficiency of an LED requires the LED to be shaped such that light generated in the device strikes the surface at the critical angle or greater, thereby preventing the internal reflection problem described above. In these LEDs, the chip is shaped as a hemisphere or truncated pyramid. Such shaping of the chip is very cumbersome and quite costly. In addition, the shapes of the surface alters the light emission profile. For example, if the top surface is in the shape of a hemisphere that is sufficiently far from the LED to assure that all light strikes the surface in the desired cone of angles, the surface will act as a lens. If the lens properties are not consistent with the product in which the LED is to be used, additional lenses must be incorporated in the product, which increases both the cost and design complexity of the product.

A second prior art method for improving the extraction efficiency utilizes a roughening of the upper surface or side surfaces of the LED by etching to destroy the planar nature of the surface thereby providing a large variety of non-planar facets through which light striking the surface can exit. While any particular facet will still allow only a fraction of the light striking it to escape, the light that is reflected back into the LED will again be reflected to the roughened surface and strike another facet whose orientation is not correlated with that of the first facet. Hence, some of this light will also escape. The light that is again reflected is recycled back to the surface and again has another chance to escape, and so on. As a result, a considerably higher fraction of the light generated in the LED is coupled out of the LED.

The prior art methods for roughening the surface involve a random etching of the top surface of the outermost crystalline layer of the LED. For example, an irregular etch pattern can be generated by depositing particles on the surface of the LED and then using the particles to define a random etch mask. The resulting pattern has at least two problems. First, the pattern can leave islands in the top electrode, which is deposited on the etched surface after the etching operation is completed. These islands are not connected to the top electrode contact through which the power connection to the electrode is made. Hence, the portion of the LED under these islands does not generate light. As a result the effective area of the LED, and hence the total light generated, is reduced.

Second, in GaN-based LEDs, the p-n junction, which contains the light generation region is placed very close to the upper surface to minimize the thickness of the p-doped material. The p-doped material has a very high resistivity and high absorption, and hence, a significant amount of power is lost if the layer is thick. If a thin p-layer is used and then etched, the etching often destroys a substantial portion of the junction. The destroyed portions do not generate light. This leads to a further reduction in the effective light generation area. If a thick layer is used, the problems associated with the high resistivity and absorption reduce the device performance.

SUMMARY OF THE INVENTION

The present invention includes a light-emitting device that includes an LED and a light extraction layer and the method for making the same. The LED includes a substrate on which an active layer is sandwiched between a p-type layer and an n-type layer, the active layer generating light in a band of wavelengths about a central wavelength when holes and electrons recombine therein. The n-type layer, active layer, and p-type layer are formed on the substrate. First and second electrodes for providing a potential difference between the p-type layer and the n-type layer are included in the LED. The light extraction layer includes a clear layer of material having a first surface in contact with a surface of the LED and a second surface having light scattering features with dimensions greater than 0.5 times the central wavelength. The material of the clear layer can be polycrystalline or amorphous. The material has an index of refraction greater than 1.4, and preferably greater than 2. The light extraction layer can be in contact with the outer surface of the substrate or one of the electrodes.

BRIEF DESCRIPTION OF THE DRAWINGS

FIG. 1 is a simplified cross-sectional view of a GaN-based LED.

FIG. 2 is a cross-sectional view of an LED according to one embodiment of the present invention.

DETAILED DESCRIPTION OF THE PREFERRED EMBODIMENTS OF THE INVENTION

Figure 3:
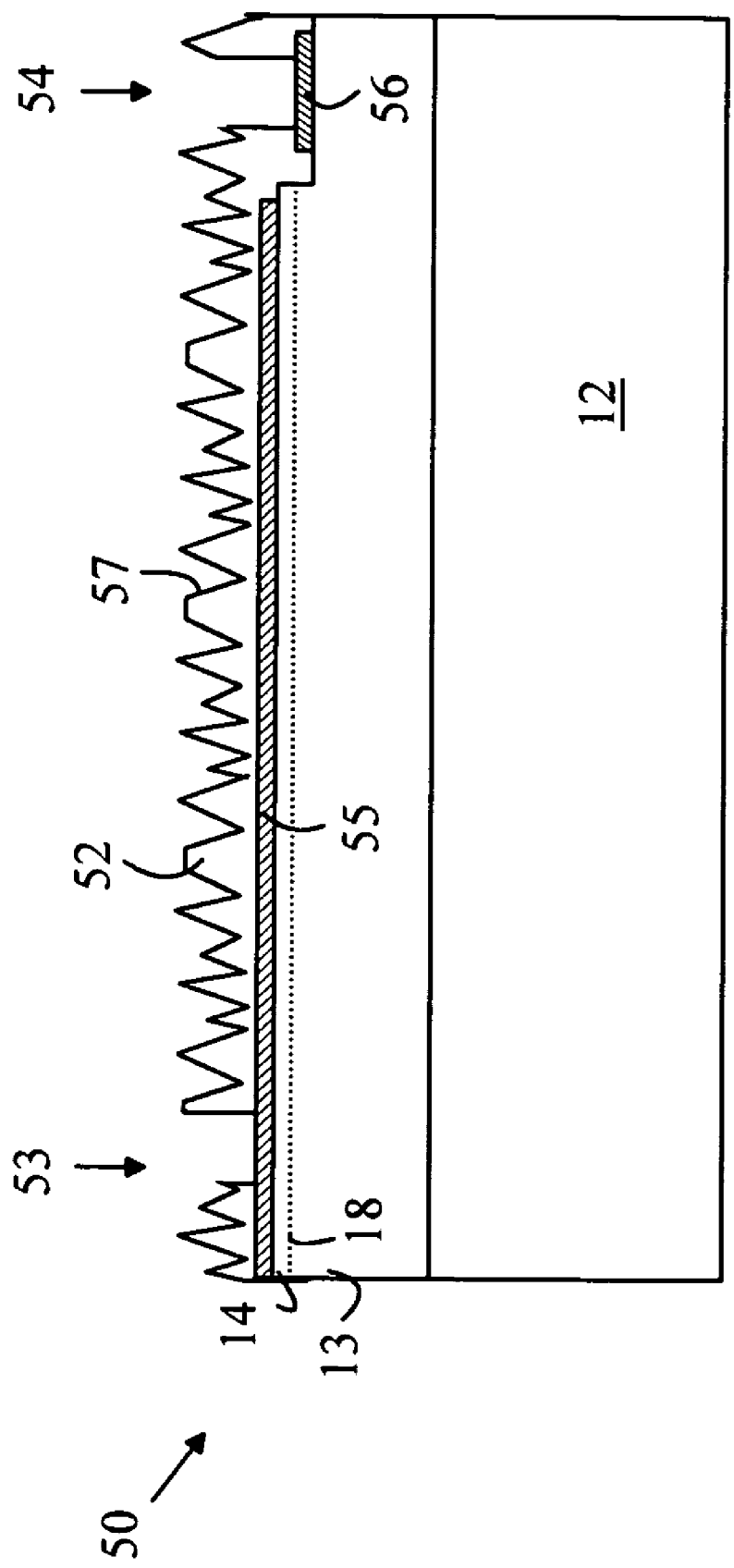
FIG. 3 is a cross-sectional view of another embodiment of the present invention.

The manner in which the present invention achieves its advantages may be more easily understood with reference to FIG. 1, which is a simplified cross-sectional view of a GaN-based LED. LED 20 is constructed on a sapphire substrate 12 by growing two layers of GaN epitaxially on the substrate. The first layer 13 is doped to be n-type, and the second layer 14 is doped to be p-type. A light generation region 18 is sandwiched between these two layers. In general, the light generation region consists of a number of layers which include a layer in which holes and electrons recombine to generate light, and cladding layers on each side of this layer. Light is generated in the light generation layer by the recombination of holes and electrons that are injected from the p-n diode layers. Since, the details of these layers are well known to those skilled in the art, and these details are not pertinent to the manner in which the present invention achieves its advantages, these layers are shown as a single line in the Figures. To simplify the following discussion, the light generation region will be referred to as the p-n junction region.

A transparent electrode 15 is deposited on the surface of the p-type layer. A second electrode 16 is deposited on a portion of the GaN layer that has been etched back to layer 13 to provide the n-contact.

As noted above, a substantial fraction of the light generated at the light generation region is trapped within the GaN layers because of the high indices of refraction of the GaN and sapphire layers relative to the air or encapsulant used on the outside surfaces of the LED. The high index of refraction leads to a small critical angle since the critical angle depends on the ratio of the indices of refraction of the two materials at the boundary. Light striking the surface at angles greater than the critical angle with respect to the normal of the surface is totally reflected by the GaN surface. This light bounces back and forth between electrode 15 and the surface of the sapphire/GaN layer as shown at 17. Much of this light is eventually absorbed, and hence, does not provide a useful output.

Refer now to FIG. 2, which is a cross-sectional view of an LED according to one embodiment of the present invention. Those elements of LED 30 that perform functions analogous to those performed by elements of LED 20 discussed above have been given the same numerical designations and will not be discussed further here unless such discussion is needed to understand LED 30. LED 30 includes an amorphous or polycrystalline light extraction layer 31 having a rough bottom surface 32. Layer 31 is deposited on the bottom surface of substrate 12. The bottom surface scatters light that is directed to the surface either because the light left active region 18 in a direction toward surface 32 or because the light was reflected from the interface boundary between electrode 15 and layer 14. Some of the scattered light will be redirected back toward electrode 15 as shown at 34, and some of the light will exit LED 30 through surface 32 as shown at 35. If electrode 15 is transparent, some of the light shown at 34 will strike the surface of layer 14 at angles greater than the critical angle and escape from the top surface of LED 30. The remaining light will be reflected back toward surface 32 and will again be scattered in a manner similar to ray 33. If electrode 15 is reflective, then all of the light reaching that electrode will be reflected back to surface 32 and will be scattered or transmitted.

The scattering profile of the light striking surface 32 will depend on the details of the rough surface at the point at which a particular light ray intersects that surface. If the detailed features on surface 32 are of the order of the wavelength of the light generated in active region 18, the light will be scattered in a number of different directions. This is the case shown in FIG. 2. For a randomly rough surface, the scattered light will take on a lambertian profile.

If the features are significantly larger than the wavelength of light, the surface can be approximated by a number of planar facets at random angles with respect to the normal to the surface of layer 14. In this case, each ray would either be scattered at a particular angle or transmitted by the surface depending on the angle of incidence on the facet. Consider a ray that is reflected back toward the surface of layer 14 at an angle such that the ray is again reflected back to surface 32. When the reflected ray strikes a new facet on surface 32, it will again either be reflected back at an angle determined by the orientation of the facet or be transmitted through the surface. Since the facets are randomly oriented, the probability of being reflected back into the LED is independent of the previous reflections suffered by the ray, and hence, on average, some fraction of the light will escape at each reflection from surface 32.

In general, the feature size and orientation are chosen such that a ray that is generated in the active layer and reflected toward the rough surface will, on average, exit one of the surfaces of the LED on striking the rough surface or being reflected from the rough surface and striking the opposite surface of the LED with a probability that is greater than zero. Preferably, the probability will be greater than ⅙. In one embodiment of the invention, layer 31 has a thickness that is at least 3 wavelengths of light thick.

Ideally, the index of refraction of layer 31 is the same as that of substrate 12. High index of refraction materials such as AlN, $TiO_2$, $BaTiO_3$, and SiC can be utilized for layer 31, since these materials have indices of refraction that are close to that of sapphire. For example, AlN has an index of refraction of approximately 2.1.

It should be noted that a layer having a higher index of refraction than substrate 12 has some additional benefits. If the index of refraction of layer 31 is less than that of substrate 12, some of the light striking the surface will be reflected back into substrate 12 due to internal reflection and will be trapped between boundary 38 and the top surface of layer 14. This light will be lost due to re-absorption.

If, on the other hand, layer 31 has a higher index of refraction than layer 12 all of the light that strikes boundary 38 from substrate 12 will enter layer 31. Part of this light will be transmitted by the rough surface and part of this light will return to boundary 38. Part of the returning light will be reflected back toward the rough surface by internal reflection and the remainder will re-enter substrate 12 and be recycled back to boundary 38. Hence all of the light is subject to recycling.

While ideally the index of refraction of layer 31 is closely matched to that of substrate 12 or larger than that of substrate 12, any material that provides an index of refraction that is intermediate between that of the surrounding environment 37 and substrate 12 will provide an improvement over embodiments that lack layer 31. The index of refraction of GaN-based semiconductors is approximately 2.5. The critical angle for an air interface is approximately 24 degrees. The critical angle for a material having an index of refraction of 1.5 is approximately 37 degrees. Hence, if layer 31 is constructed from a material having an index of refraction of 1.5, the light striking the boundary of substrate 12 at angles between 24 and 37 degrees that would have been lost to internal reflection will enter layer 31, and a significant fraction of that light will be recovered.

The ideal material for layer 31 would also be one that can be deposited in a manner that leaves the final surface in a rough state so that no additional etching steps are needed. In principle, any material, including the sapphire substrate could be etched to provide a rough surface by first lithographically patterning a mask on the surface and then etching the unmasked areas. However, the additional steps substantially increase the cost of the LEDs. In addition, sapphire is not easily etched. If the material cannot be deposited in a manner that produces the final rough surface, a material that can be etched to form the rough surface without the need to utilize a lithographically generated mask is preferred.

In one embodiment of the present invention, a high index of refraction material such as AlN is deposited on the sapphire surface after the fabrication of the LEDs has been completed. For example, polycrystalline AlN can be deposited by RF sputtering techniques at low temperatures. The polycrystalline layer can be etched to yield a rough surface having a roughness that is controlled by controlling the etching conditions. It should be noted that the AlN etches anisotropically due to the random orientations of the crystals in the polycrystalline layer. Different crystal orientations etch at different rates.

The polycrystalline layer can be etched using either dry or wet etching systems. AlN can be etched using a reactive gas such as $CF_4$ or $SF_6$. The etch rate is controlled by varying the etch conditions such as RF power, pressure, background gas, etc. As a result, a rough surface is obtained without the need to lithographically mask the surface prior to etching.

The roughness of the surface can also be controlled by the deposition process. If a high deposition rate is utilized at the beginning of the deposition process, non-uniform growth is enhanced. If the resultant layer can be formed at the high deposition rate, the final surface may have sufficient roughness to provide the light extraction surface. If the resultant surface has too many defects, a slower growth rate can then be used to provide the desired final thickness. In this case, the surface can be etched as described above to provide the final rough surface. It should be noted that the etching does not involve etching the LED layers, and hence, problems associated with introducing defects into the LED are avoided by the present invention.

Refer again to FIG. 2, while the preferred material for the light extraction layer described above has an index of refraction that is greater than or equal to that of substrate 12, as noted above, a significant improvement can still be realized if the light extraction layer has an index of refraction that is between that of the surrounding medium 37 and substrate 12. Hence, clear amorphous materials such as glass and polymers that can be deposited with a rough surface or etched after deposition can still provide a substantial improvement. The lower cost of depositing these materials on substrate 12 can compensate for their inferior light extraction performance in many cases.

It should be noted that these materials can be roughened after deposition by abrasive polishing as well as chemical etching. For example, Phosphoric acid at an elevated temperature can be used to etch AlN in an anisotropic manner. For RF sputtered AlN, the etch rate along one of the different crystalline directions can be substantially higher. Embodiments that utilize plastics or other moldable polymers can utilize a rough surface on a mold to provide the rough surface.

The above-described embodiments of the present invention utilize an LED design in which the light is extracted through the substrate utilizing a light extraction layer that is on the exposed surfaces of the substrate. While this configuration has a number of advantages relative to designs in which light is extracted through the electrodes, the light extraction scheme of the present invention can still be applied to such top emitting designs.

Refer now to FIG. 3, which is a cross-sectional view of another embodiment of the present invention. LED 50 is similar to LED 30 discussed above in that LED 30 includes a light-emitting layer 18 sandwiched between two layers, 13 and 14, to form a diode structure. The various layers are grown on a substrate 12. The bottom surface of substrate 12 includes a reflective layer to direct light that would otherwise leave through the bottom surface back toward the top surface of the LED. LED 50 is powered by providing a potential difference between electrodes 55 and 56. Since light is extracted through the top surface of LED 50, electrode 55 is a transparent electrode such as an ITO electrode. Alternately, an interdigitated electrode configuration may be used to contact the top surface of LED 50.

Once all of the LEDs have been fabricated through the deposition of electrodes 55 and 56, a light extraction layer 52 is deposited and processed to provide a rough surface 57. The layer can be deposited using any of the materials and/or roughening techniques described above. The roughened layer differs from those described above in that the two openings shown at 53 and 54 must be provided so that electrodes 55 and 56 can be accessed. The openings can be cut in the layer either prior to roughing the layer or after the roughening has been performed using conventional lithographic etching techniques. Alternatively, the location for the openings can be masked prior to depositing and roughening layer 52. The mask material can then be removed to provide the openings in question.

It should be noted that the extraction layers of the present invention can be provided at the wafer scale, after the LEDs have been completed, through the top electrode but prior to dicing the wafer. Hence, the economies of scale of wafer processing can be achieved. It should also be noted that the light extraction layer of the present invention does not interfere with the functioning of the various LED layers, since these layers are not roughened or otherwise processed in a manner that could damage the layers in question.

The present invention is particularly useful for LEDs constructed from the GaN family of materials and other material systems having high indices of refraction such as Sapphire or Silicon Carbide. For the purposes of the present discussion, the GaN family of materials will be defined to be AlGaN, InGaN and GaN. However, the present invention may be applied to LEDs constructed from other families of materials.

Various modifications to the present invention will become apparent to those skilled in the art from the foregoing description and accompanying drawings. Accordingly, the present invention is to be limited solely by the scope of the following claims.

What is claimed is:

1. A light-emitting device comprising an LED and a light extraction layer, the LED comprising:

a substrate having a first surface and an opposing second surface;

an active layer sandwiched between a first layer having a first type of doping and a second layer having a second type of doping, the active layer generating light when holes and electrons recombine therein, the first layer, active layer, and second layer located on the first surface of the substrate, the first and second layers being substantially planar;

a first electrode connected to the first layer, the first electrode being substantially transparent, and substantially planar;

a second electrode connected to the second layer; the first electrode and the second electrode configured to provide a potential difference between the first layer and the second layer; and the light extraction layer located on the second surface of the substrate, the light extraction layer comprising:

a clear layer of material with a top surface and a bottom surface; and random light scattering features located on the bottom surface of the clear layer of material;

wherein the top surface of the clear layer of material is substantially planar and connected to the second surface of the substrate and wherein the index of refraction of the light extraction layer is equal to or greater than that of the substrate, and less than or equal to that of the surrounding medium of the substrate, wherein light entering the surrounding medium from the light extraction layer not under a condition of total internal reflection exits the light extraction layer through the surrounding medium.

2. The light-emitting device of claim 1, wherein the clear layer of material is an amorphous material chosen from the group consisting of glass and polymers.

3. The light-emitting device of claim 1, wherein the clear layer of material has an index of refraction greater than 2.

4. The light-emitting device of claim 1, wherein the substrate comprises sapphire or SiC.

5. The light-emitting device of claim 1, wherein the light extraction layer is on a first side of the light-emitting device and the first and second electrodes are on an opposing second side of the light-emitting device.

6. The light-emitting device of claim 1, wherein the light extraction layer is formed from moldable plastics or moldable polymers.

7. The light-emitting device of claim 1, wherein the light extraction layer has a thickness at least 3 wavelengths of light thick.

8. The light-emitting device of claim 1, wherein light emitted from the light-emitting device is in a band of wavelengths about a central wavelength and wherein the random light scattering features have dimensions greater than 0.5 times the central wavelength.

* * * * *